Figure 1:
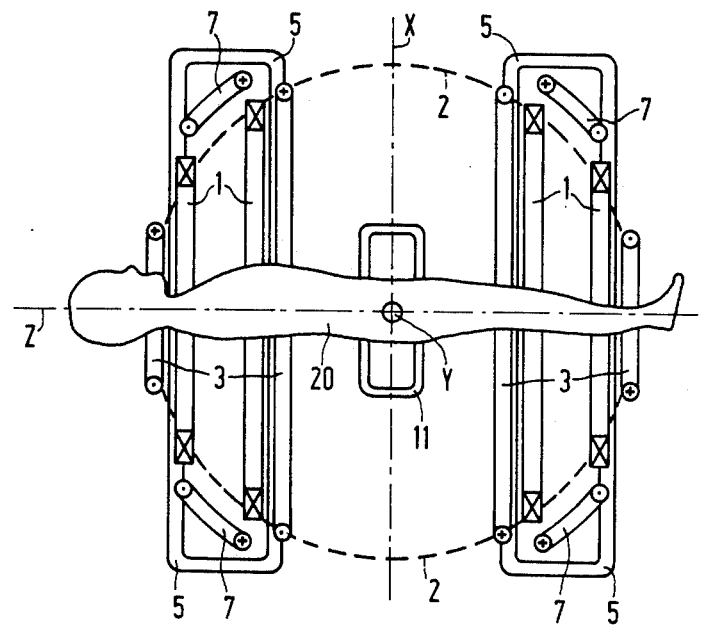

United States Patent [19]

Kuhn et al.

[11] Patent Number: 4,767,990
[45] Date of Patent: Aug. 30, 1988

[54] NUCLEAR MAGNETIC RESONANCE EXAMINATION METHOD

[75] Inventors: Michael H. Kuhn, Hamburg; Dietmar W. Kunz, Quickborn, both of Fed. Rep. of Germany

[73] Assignee: U.S. Philips Corporation, New York, N.Y.

[21] Appl. No.: 879,701

[22] Filed: Jun. 27, 1986

[30] Foreign Application Priority Data

Jul. 11, 1985 [DE] Fed. Rep. of Germany ....... 3524682

[51] Int. Cl.$^4$ ........................................... G01R 33/20
[52] U.S. Cl. .................................... 324/309; 324/307
[58] Field of Search ............... 324/307, 309, 312, 313, 324/314

[56] References Cited

U.S. PATENT DOCUMENTS 4,558,277 12/1985 Post et al. ........................... 324/307
4,644,280 2/1987 Paltiel ................................. 324/309

Primary Examiner—Stewart J. Levy
Assistant Examiner—Louis M. Arana
Attorney, Agent, or Firm—Paul R. Miller

[57] ABSTRACT

The invention relates to a nuclear magnetic resonance examination method for the selective excitation of a limited volume of a body under examination, in which the excitation is effected by three successive frequency-modulated pulses the first and the third of which are equal to one another and the second of which is a 180° pulse. A gradient magnetic field, the gradient of which runs each time in one of three directions perpendicular to one another, is active during each of the three pulses.

8 Claims, 4 Drawing Sheets

NUCLEAR MAGNETIC RESONANCE EXAMINATION METHOD

The invention relates to a nuclear magnetic resonance examination method for the selective excitation of a limited volume of a body under examination, wherein the body is exposed to an homogeneous stationary magnetic field, three sequences of a high-frequency magnetic field perpendicular to the stationary magnetic field and, during at least one of the three sequences, to a gradient magnetic field running in the direction of the stationary magnetic field.

Such a method for the selective excitation of a partial volume of a body being examined is known from J. Mag. Res. 56, 350-354 (1984). It can be used in examinations when the purpose is to obtain information only from the part volume, e.g. during examinations of organs inside the body of a patient. In the known method each of the three sequences consists of three amplitude-modulated high-frequency pulses, the first and third of which are narrow-band 45°-pulses and the second is a wide-band 90°-pulse. A gradient magnetic field is active during each sequence, and the gradients of the three magnetic fields active during the three sequences run in directions perpendicular to one another. After the excitation the nuclear magnetization inside the part volume being excited is shifted through 180° compared with the state before the sequences were executed. Outside the part volume the shift is only 90°, and it rapidly de-phases there under the influence of inhomogeneities of the stationary field so that in a measuring procedure executed subsequently this area has no influence in the measuring signals generated in this procedure.

However, the known method has the disadvantage that the 90°-pulse must not be allowed to produce either locally dependent flip angles (the flip angle is the angle which the nuclear magnetization vector forms with the direction of the stationary magnetic field) or locally dependent phases because otherwise interference signals are generated from areas outside the volume under excitation. This is usually achieved by the fact that such a pulse is amplitude-modulated and so wide-banded that its spectrum covers the whole range being investigated despite the presence of gradient fields. While this is possible on a small scale, the high-frequency peak powers required for the examination of large volumes, e.g. the examination of a human body, impose requirements on the high-frequency power amplifier which are almost impossible to meet.

It is the aim of the present invention to outline a method which also enables a limited volume to be excited by maintaining or inverting the nuclear magnetization inside this volume and de-phasing it outside the volume, but imposes less severe requirements on the high-frequency power amplifier.

Based on a method of the type described in the preamble, the invention achieves this aim as follows: the first sequence consists of a first pulse which flips the nuclear magnetization through at least approximately 90°, the second sequence consists of a 180°-pulse, the third sequence consists of a third pulse which flips the nuclear magnetization through the same angle as the first pulse and the phase position of which is selected in such a way that, in the volume to be selected, the nuclear magnetization is flipped in the direction of the static field or in the opposing direction, at least the pulse during which the gradient field is active is frequency-modulated and the centre of the second pulse has the same time interval from the centres of the first and third pulses.

The arrangement for implementation of the method comprises a magnet for the generation of a static homogeneous magnetic field, three coil arrangements for the generation of gradient magnetic fields, which run in the direction of the static magnetic field and the gradients of which run in three directions perpendicular to one another, and a high-frequency coil for the generation of high-frequency, magnetic fields which run perpendicular to the direction of the static magnetic field, as well as control devices for activation of the coil arrangements and the high-frequency coil arrangement; in accordance with the invention an FM modulator is coupled to the high-frequency coil arrangement and the control equipment controls the high-frequency coil arrangement and at least one of the three coil arrangements in such a way that during each high-frequency pulse another of the three coil arrangements is active.

According to the invention, the magnetization is flipped though 90° by the first pulse. The magnetization vector then lies in the xy-plane of a system of cartesian coordinates the z-direction of which coincides with the direction of the static magnetic field and the origin of which is a point at which only the static magnetic field, but not the gradient magnetic fields are present. As a result of the subsequent 180°-pulse the magnetization vector, which lies in the xy-plane of a coordinate system rotating at Larmor frequency about the z-axis, is mirrored about an axis. The magnetization vector lies in the rotating coordinate system as the result of which, again in the xy-plane, its position can be turned through 0° to 180° compared with the position before the second pulse. The third pulse is identical to the first pulse with regard to amplitude and time behaviour. The effect of this third pulse, by which the nuclear magnetization can be flipped through 90°, depends on the angle in the rotating coordinate system between, on the one hand, the nuclear magnetization vector at the different points of the area of examination and, on the other, the component of the high-frequency pulse rotating with the coordinate system. Depending on this angle, the spins may be brought back into the direction of the main field, i.e. in the + or − z-direction, which permits later excitation by a high-frequency pulse, or they may be left in the x-y plane which results in rapid de-phasing and the fact that these spins can no longer contribute to a detectable signal. If the phase angle between the high-frequency pulse and the spin varies rapidly as a function of the location, this also leads to de-phasing and therefore to disappearance of the signal. For subsequent excitations, therefore, only those spins are available for which
  (a) the phase angle between the third high-frequency pulse and the spin as a function of all three directions in space is at least approximately constant and
  (b) this phase angle is selected in such a way that after the pulse the spins are parallel or antiparallel with the direction of the main field.

The part volume in which these conditions are satisfied is achieved by the fact that a gradient magnetic field is active during at least one high-frequency pulse and at least this high-frequency pulse is frequency-modulated, preferably linearly fequency-modulated. If, in fact, a gradient magnetic field is active during a linearly frequency-modulated high-frequency pulse, this has the result that the angle which the nuclear spins in the xy-plane form with the rotating coordinate system varies parabolically as a function of the direction of the gradient of this field. Only the areas at the peak of this (quadratic) parabola can satisfy condition a).

If a gradient field is active only during one frequency-modulated high-frequency pulse, then the invention method can be used to select a slice (inside this slice, therefore, the nuclear spins are oriented largely parallel or antiparallel to the direction of the magnetic field, whereas outside the slice they are de-phased), which extends perpendicular to the direction of the gradient of the magnetic field and the thickness of which is so much the greater the more rapidly the instantaneous frequency of the frequency-modulated high-frequency pulse varies and the lower the gradient of this magnetic field.

If a gradient magnetic field is brought into action during each of the three high-frequency pulses, in which case the directions of the gradients of these fields are perpendicular to one another, then a volume, limited on all sides, can be selected.

Because it is possible to generate frequency pulses with high band width and low peak power, relatively high gradient fields can also be used in this method. This makes it possible to precisely fix the volume to be excited. Furthermore, the frequency modulation of the high-frequency pulses has the advantage over amplitude modulation that the high-frequency peak power can be much smaller.

According to a further extension of the invention, at least one gradient magnetic field is active between the first and the second or between the second and the third pulses. As the result of a gradient field active between the high-frequency pulses, the angle of the nuclear spin in the rotating coordinate system in the direction of the gradient is modified linearly as a function of the location. This shifts the region in which the condition a) is satisfied in the direction of the gradient or the opposing direction. This means therefore that the position of the selected region can be changed by this refinement. If the size of these gradient fields is made variable, then the position of the selected region can be adjusted to suit diagnostic requirements.

Figure 2:
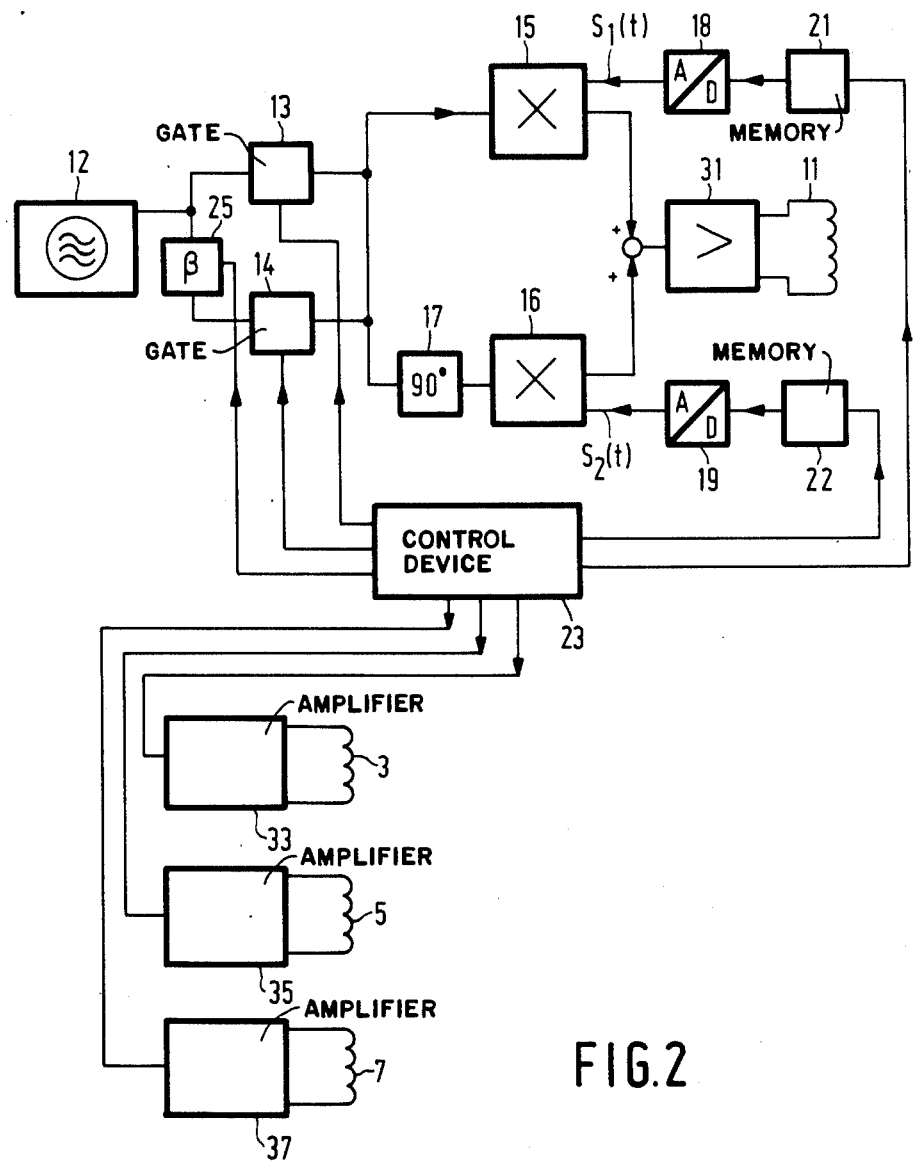

The invention will be explained in greater detail with the aid of the drawings which show:

FIG. 1 a nuclear magnetic resonance examination unit, to which the invention can be applied, FIG. 2 a block circuit diagram of a device for generating the high-frequency pulses required for the arrangement in FIG. 1 and for producing the gradient fields, FIG. 3 the behaviour with time of the high-frequency pulses and the gradient fields in the different coordinate directions and FIG. 4 the spatial behaviour of the angle which the nuclear spins form with the rotating coordinate system in different examination phases.

The NMR examination unit, a so-called NMR tomograph, illustrated schematically in FIG. 1 contains an arrangement comprising 4 coils 1 for the generation of an homogeneous static magnetic field of, for example, 2T. The coils arranged concentrically with the z-axis can be mounted on a spherical surface 2.

For the generation of a gradient magnetic field running in the z-direction, the gradient of which also runs in the z-direction, four coils 3 are mounted, preferentially, on the same spherical surface. The gradient field running in the z-direction, the field strength of which varies in the y-direction, i.e. perpendicular to the drawing plane, is generated by four coils 5 only two of which are illustrated in FIG. 1. The magnetic field in the z-direction with a gradient in the x-direction is generated by four coils 7 which may be identical with the coils 5 but which are staggered by 90° with respect to these. Since each of the three coil arrangements 3, 5 and 7 for the generation of gradient magnetic fields are arranged symmetrically with the spherical surface 2, the magnetic field strength in the centre of the sphere, which simultaneously forms the origin of a cartesian x-, y-, z-coordinate system, is determined only by the static homogeneous magnetic field of coil 1.

In addition, a high-frequency coil 11 is arranged symmetrically to the plane z=0 of the coordinate system and is designed in such a way as to produce an essentially homogeneous high-frequency field running in the x-direction (i.e. at right angles to the direction of the static homogeneous magnetic field). A high-frequency frequency-modulated current is supplied from an amplifier 31 to the high-frequency coil 11 during each high-frequency pulse. The circuit, shown in FIG. 2, for the generation of this current contains a high-frequency oscillator 12 which at its output delivers an oscillator signal the frequency of which corresponds exactly with the Larmor frequency which in its turn is proportional to the strength of the static homogeneous magnetic field. The output is connected to a quadrature circuit via controllable gates 13, 14 only one of which—controlled by a control device 23—lets through the signal, and in series with gate 14 there is a phase shifter 25 with phase position controlled by the control device 23. In one of its branches the quadrature contains a mixer 15 and in its other branch the series circuit of a 90° phase shifter and a mixer 16, the output signals of mixers 15 and 16 being added and fed to the amplifier 31. The signal—phase—shifted if necessary—is multiplied in each of the mixing stages 15 and 16 with an envelope signal ($s_1(t)$ or $s_2(t)$) as the case may be which is supplied from a memory 21 or 22 respectively via a digital-analog converter 18 or 19 respectively and represents the real or the imaginary part of a complex envelope signal. These signals are selected in such a way that the sum of the oscillator signals yields a signal which corresponds to a frequency-modulated oscillation with a frequency which varies essentially linearly with time. The envelope signals stored in the memories 21, 22 as a result of support points can be calculated as follows using a computer (not shown in detail):

(a) First of all, the variation a with time of the angular frequency in the frequency-modulated signal is determined using the equation $$a = 1 \cdot \gamma \cdot G / T_o \qquad (1)$$

where 1 is a distance which is large compared with the dimensions of the volume to be excited (in the direction of the gradient field applied in each case), $\gamma$ is the gyromagnetic ratio (for protons approx. 42.5 MHz/T), G is the gradient for the gradient magnetic field applied during the frequency-modulated pulse and $T_o$ is the duration of the high-frequency pulse. The larger the pulse duration selected, the lower the peak power required; however, when the pulse duration is too long, the influence of the T1 and T2 relaxation times makes itself felt.

(b) The frequency-modulated time function $s_0(t)$ which is represented by the equation $$s_0(t) = \exp(-iat^2/2) \qquad (2)$$

is Fourier-transformed into the complex frequency range. In this case $i = (-1)^{\frac{1}{2}}$ (c) The complex signal Fourier-transformed in this way is multiplied by a complex spectral function f(w), which satisfies the condition $$f(w) = \begin{cases} 1 & \text{for } /w - w_0/ \leq \Delta w \\ \exp(-0.5(/w - w_0/ - \Delta w^2)/(b^2) & \text{for } /w - w_0/ \geq \Delta w \end{cases} \qquad (3)$$

where w is the (variable) angular frequency, $w_0$ is the Larmor angular frequency, b is a factor defining the steepness of the spectral function and $\Delta w$ is the band width of the time signal for which the following relationship is valid $$\Delta w = aT_o \qquad (4)$$

The smaller the value of b, the more rectangular the pattern of the frequency spectrum of the frequency-modulated pulse. A suitable value is $b = 500\pi/\text{sec}$ (at band width of 10 kHz).

(d) The product thus formed is inverse-transformed into the time range. The resulting complex time signal has the form $$s(t) = s_1(t) + is_2(t), \qquad (5)$$

where $s_1(t)$ is the real part and $s_2$ the imaginary part of the time signal. The signals $s_1(t)$ and $s_2(t)$ determined in this way are envelope signals which are calculated for a series of support points and filed in the memories 21 and 22. At the output of amplifier 31, therefore, there appears a signal u(t) which satisfies the condition $$u(t) = s_1(t)\cos w_0 t + s_2(t)\sin w_0 t \qquad (6)$$

in which the sign of the addend depends on whether the signal at the input of the element 17 lags by 90° or is 90° in advance of the signal at its output.

Figure 3A:
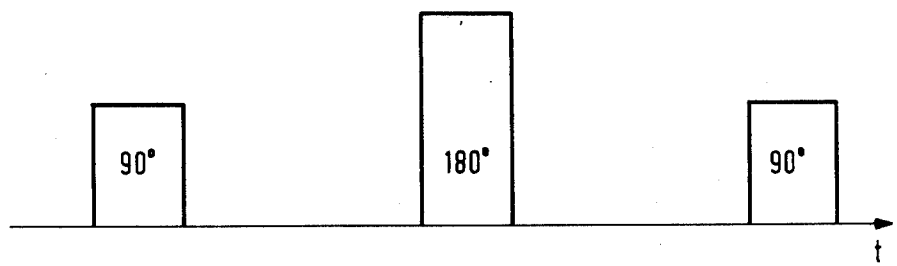
Figure 3B:
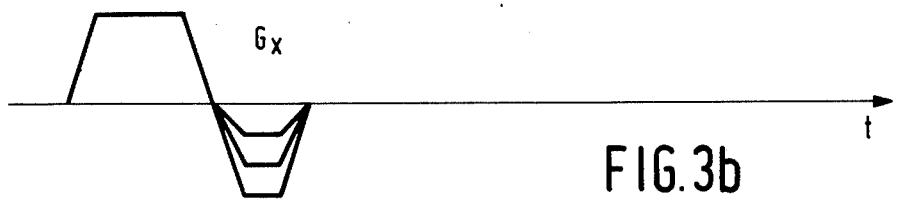
Figure 3C:
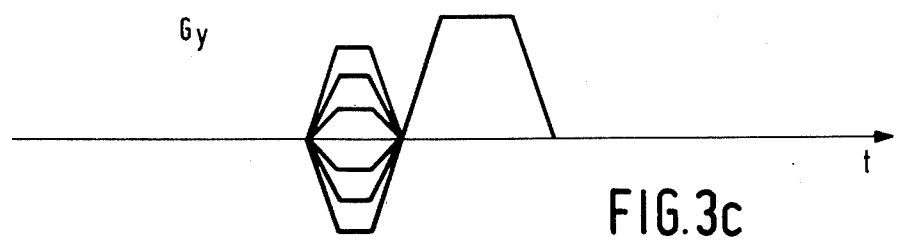
Figure 3D:
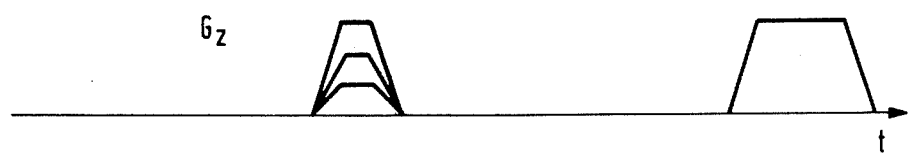

During the first high-frequency pulse generated in this way which flips the magnetization vector through 90°, a current is fed to coil arrangement 7 via an amplifier 37, controlled by control device 23, in such a way that this coil produces a gradient magnetic field the gradient of which is active in the x-direction. The time response of this gradient $G_x$ is shown in FIG. 3b, while the time response of the high-frequency pulse can be seen in FIG. 3a.

Figure 4A:
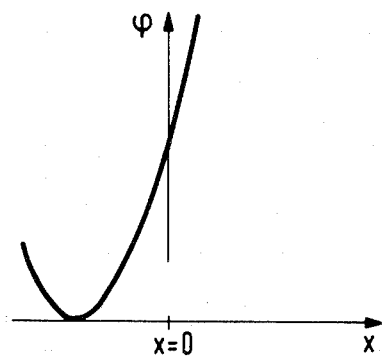
Figure 4B:
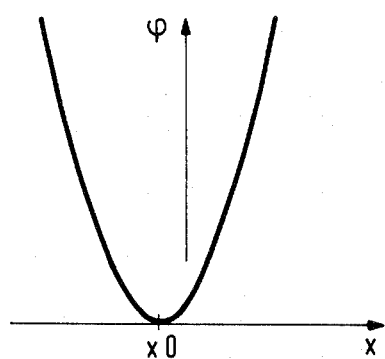

The effect of the gradient magnetic field is that the nuclear spins flipped into the x-y plane exhibit a phase angle in the xy-plane which varies parabolically in the x-direction. This is illustrated in FIG. 4a which shows this phase angle as a function of the x-coordinate. It can be seen that the peak of the parabola representing the dependence of the phase angle does not lie in the plane x=0 of the cartesian coordinate system, but outside it. Because the phase angle has a slight local dependence only in the area of this peak and because only the spatial area defined by this peak can be selected by the invention method, it may be necessary to shift this area in the x-direction. This shift is achieved by switching in a gradient magnetic field with gradient running in the x-direction after the first high-frequency pulse and before the second high-frequency pulse. Thanks to this gradient which is active outside the high-frequency pulses the nuclear spins undergo a phase shift with respect to the rotating coordinate system which is linearly dependent on the x-coordinate. Because the superimposition of the parabolic local dependence of the phase angle (during a frequency-modulated pulse) and the linear local dependence of the phase angle result in their turn in a parabolic dependence, but with summit displaced in the x-direction, this leads to a shifting of the vertex as far as the coordinate x=x0. In order that this shift takes place in the direction of the origin of the coordinates, the gradient must have the opposite polarity after the high-frequency pulse to that during the pulse. The greater the gradient, the greater the shift.

Figure 4C:
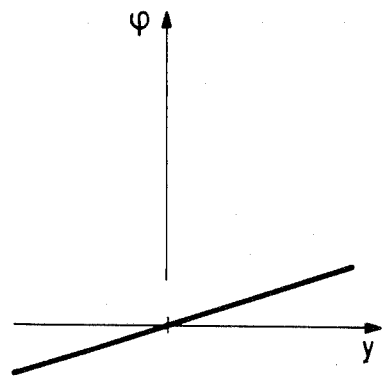
Figure 4D:
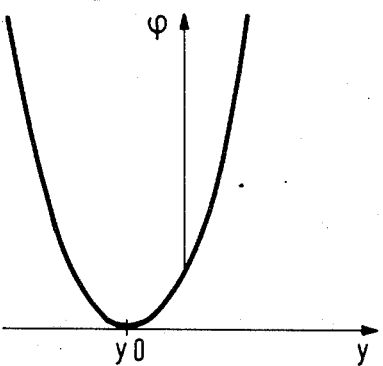
Figure 4E:
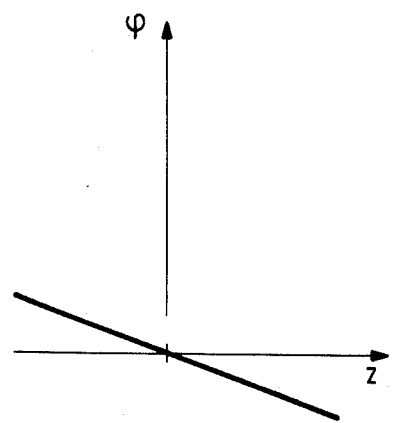
Figure 4F:
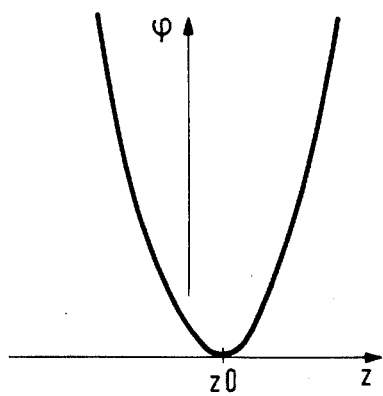

After the first and before the second high-frequency pulse the gradient coil arrangements 3 and 5 can also be excited by way of amplifiers 33 and 35, controlled by control device 23, such that gradient magnetic fields with a gradient Gy in the x-direction and a gradient Gz in the z-direction are produced. These gradient fields result in a linear dependence of the phase angle in the y- and z-directions which has an influence on the position of the excited volume. This dependence of the phase angle in the y- and z-directions is shown in FIGS. 4c and 4e.

Thanks to the second high-frequency pulse which is a 180° pulse which is selected therefore in such a way that—if it were supplied as the first pulse—the nuclear magnetization could be flipped from the direction of the static magnetic field into the opposite direction, the phase angle of the nuclear spin in the rotating coordinate system is mirrored about an axis which is defined by the spatial position of the component of the high-frequency magnetic field rotating with the rotating coordinate system with respect to this coordinate system. Because a gradient magnetic field with a gradient in the y-direction is active during this second pulse, this results in a parabolic dependence of the phase angle in the y-direction the summit of which lies outside the plane y=0 (at the point y0) although a gradient field was active in the y-direction before the second pulse. The distance of the summit from the plane y=0 is so much the greater the larger the gradient in the y-direction was before the second pulse and the longer it was active.

To generate the 180° pulse, the envelope signals $s_1$ and $s_2$ designed for such a pulse are loaded into memories 21 and 22. If the memory capacity is large enough, however, the signals may also be stored in memories 21 and 22 even before the start of the pulse sequence. Under certain circumstances, however, this additional calculation and/or storage can be dispensed with, if the support points of the envelope curves for the first pulse are read out at a suitable clock rate and are multiplied by an appropriate factor. During the first and second pulses, gate 13 is open and gate 14 is closed.

The third pulse is again a 90° pulse, and its time interval from the centre of the second pulse is equal to the interval between the centres of the first and the second pulses. In order that this third high-frequency pulse can flip the nuclear spins in an area about the straight lines x=x0 and y=y0 into the z-direction or opposite direction, the component of the magnetic field of this high-frequency pulse which rotates with the nuclear spins must be perpendicular to the nuclear magnetization vector in this area. This requires therefore that the spatial position of the component of the magnetic field of the third high-frequency pulse can be adjusted. This can be achieved in a simple manner by rotating the phase position of the oscillator signal through a given angle because this phase rotation produces a rotation of equal magnitude in the angular position of the simultaneously rotating component of the magnetic field, produced by the third high-frequency pulse, in the xy-plane of the rotating coordinate system. For this reason, during the third high-frequency pulse gate 13 is closed and gate 14 is open so that the oscillator signal is rotated by the quadrature circuit 25 through an angle β calculated by control device 23 and set by the quadrature circuit 25.

The angle β depends on the gradient fields during the high-frequency magnetic fields, on the frequency changes per unit time used for the frequency-modulated pulses (a in equation (1)), on the coordinates of the location to be selected, but also on the strength of the high-frequency field, especially for the 180° pulse. It is possible, in fact to calculate the size of β for a tilting of the magnetization in the area concerned in the +z− or −z-direction, but for practical purposes an experimental procedure is recommended:

After the completion of the above-described sequence an amplitude-modulated 90° pulse is issued in the absence of gradient fields and the nuclear spin signal produced by this is received. In this case the receiver (demodulator) can be adjusted by means of preliminary experiments such that a magnetization vector deflected from the +z-direction leads to a positive real signal. If the described sequence is then repeated with the next 90° pulse and with signal detection for different settings of β, then a dependence of the signal on the value sin (β−βo) is obtained. From this the desired setting β=βo is obtained for tilting of the magnetization in the +z-direction or β=βo+π for tilting in the −z-direction.

The third pulse can have the same duration $T_o$ and the same time variation a of the angular frequency in the frequency-modulated signal as the first pulse. If, in this case, a gradient field with gradient in the z-direction of exactly the same magnitude as the gradient during the first high-frequency pulse is also switched on during the third pulse, the same dimensions of the selectively excited part volume are obtained in the z-direction as in the y-direction. In this case the same envelope signals $s_1(t)$ and $s_2(t)$ as with the first pulse can also be used. However, because gate 13 is then closed and gate 14 open, the oscillator signal is phase-shifted by the phase-shifter 25 through the angle β so that at the input of amplifier 31 there is a signal v(t) which is converted by the amplifier into a proportional current through the high-frequency coil and so that the relationship $$v(t)=s_1(t)\cos(w_o t+\beta)+s_2(t)\sin(w_o t+\beta) \quad (7)$$

is satisfied. Thus, except for the phase rotation of the oscillator signal about the angle β, the signal v(t) corresponds to the signal u(t) with which the amplifier is fed during the first high-frequency pulse.

It is not necessary for the frequency-modulated signal during the third pulse to have the same duration and the same band width as during the first pulse. If one of these quantities is changed without changing the size of the gradient of the gradient magnetic field which is active during this pulse, then the dimensions of the volume being excited may be selected differently in the z-direction from in the x-direction. In this case the envelope signals $s_1(t)$ and $s_2(t)$ for the third pulse would also have to be calculated or be present, already calculated, in the memory.

It is not necessary that the gradient magnetic fields which are active between the pulses and are used to determine the position of the selectively excited part volume should be applied between the first and the second pulses; they can also be applied between the second and third pulses. However, the gradients must then have the opposite polarity so that the same effect is achieved as with gradient fields acting between the first and second pulses. The gradient field for shifting the part volume in the x-direction would therefore have to have the same polarity as the gradient field acting during the first pulse and the gradient field used to displace the part volume in the z-direction would have to have the opposite sign from the gradient field acting during the third pulse, if the displacement by these gradient fields is to take place from the edge in the direction of the coordinate origin.

In order to be able to selectively excite a part volume of presettable position and size, the user has to specify position and size of the volume to be selectively excited using a keyboard (not illustrated) of the control device which must contain a microcomputer. From these specifications the control device determines the envelope curves for the three pulses, the size of the gradient fields acting during and between the pulses and the phase shift β and controls the connected constructional units accordingly.

What is claimed is:

1. A nuclear magnetic resonance examination method for selective excitation of a limited volume of a body, comprising the steps of exposing the body to a homogeneous static magnetic field;

exposing said body to a high frequency magnetic field, said high frequency magnetic field being perpendicular to said static magnetic field, wherein said high frequency magnetic field provides at least three successive pulses, wherein a first pulse of said three pulses flips nuclear magnetization through at least approximately 90°, wherein a second pulse of said three pulses consists of a 180° pulse, and wherein a third pulse of said three pulses flips said nuclear magnetization through at least approximately 90° with a phase position being selected to flip said nuclear magnetization into one of a direction of said static magnetization field or an opposite direction; and exposing said body to at least one gradient magnetic field in the direction of said static magnetic field during at least one of said three pulses, wherein at least one of said three pulses is frequency modulated during said at least one gradient magnetic field, and wherein a time interval from the center of said first pulse to the center of said second pulse is equal to the time interval from the center of said second pulse to the center of said third pulse.

2. A method according to claim 1, wherein at least two of said three pulses are frequency modulated, and wherein at least one of said gradient magnetic fields is active during each of said three pulses, said gradient magnetic fields providing gradients that are perpendicular to one another.

3. A method according to claim 1 or claim 2, wherein at least one other gradient magnetic field is active between said second and said third pulse.

4. A method according to claim 3, wherein said at least one other gradient magnetic field active between said pulses has a gradient in the same direction but of opposite polarity as said one gradient magnetic field being active during one of said three pulses.

5. A method according to claim 1 or claim 2, wherein said gradients of said gradient magnetic fields have adjustable magnitudes.

6. An arrangement for nuclear magnetic resonance examination of a limited volume of a body comprising
   magnet means for generating a static homogeneous magnetic field;
   three magnetic coil means arranged for generating gradient magnetic fields in the direction of said static magnetic field, said three magnetic coil means providing gradients in three perpendicular directions;
   high frequency magnetic coil means for generating high frequency magnetic fields perpendicular to said direction of said static magnetic field; and
   control means for controlling said three magnetic coil means and said high frequency magnetic coil means, said control means including frequency modulating means coupled to said high frequency magnetic coil means for actuating said high frequency magnetic coil means, and control circuit means for controlling at least one of said three magnetic coil means with said high frequency magnetic coil means such that one of said three magnetic coil means is active during at least one high frequency pulse provided by said high frequency magnetic coil means.

7. An arrangement according to claim 6, wherein said frequency modulating means includes oscillator means for generating an oscillation with Larmor frequency, said oscillator means being coupled to a first mixing circuit and to a 90°-phase shifter in series with a second mixing circuit, said first and second mixing circuits multiplying said oscillation with envelop signals, said envelop signals being selected to provide a sum of output signals corresponding to a linearly frequency modulated oscillation.

8. An arrangement according to claim 7 wherein a phase shifting circuit is disposed for providing variable phase rotation to said mixing circuits.

* * * * *